(12) United States Patent
Park et al.

(10) Patent No.: US 12,328,877 B2
(45) Date of Patent: Jun. 10, 2025

(54) VERTICAL SEMICONDUCTOR DEVICE AND METHOD FOR FABRICATING THE VERTICAL SEMICONDUCTOR DEVICE

(71) Applicant: SK hynix Inc., Icheon-si (KR)

(72) Inventors: In-Su Park, Icheon-si (KR); Jong-Gi Kim, Yongin-si (KR); Hai-Won Kim, Icheon-si (KR); Hoe-Min Jeong, Seoul (KR)

(73) Assignee: SK hynix Inc., Icheon-si (KR)

( * ) Notice: Subject to any disclaimer, the term of this patent is extended or adjusted under 35 U.S.C. 154(b) by 85 days.

(21) Appl. No.: 18/446,827

(22) Filed: Aug. 9, 2023

(65) Prior Publication Data

US 2023/0403855 A1    Dec. 14, 2023

Related U.S. Application Data

(63) Continuation of application No. 17/567,423, filed on Jan. 3, 2022, now Pat. No. 11,751,395, which is a continuation of application No. 16/680,219, filed on Nov. 11, 2019, now Pat. No. 11,244,956.

(30) Foreign Application Priority Data

Apr. 11, 2019    (KR) .................. 10-2019-0042570

(51) Int. Cl.
*H10B 43/27* (2023.01)
*H01L 21/285* (2006.01)
(Continued)

(52) U.S. Cl.
CPC ....... *H10B 43/27* (2023.02); *H01L 21/28525* (2013.01); *H01L 21/76805* (2013.01);
(Continued)

(58) Field of Classification Search
CPC ........ H10B 41/20; H10B 41/23; H10B 41/27; H10B 43/20; H10B 43/23; H10B 43/27; H10B 51/20
See application file for complete search history.

(56) References Cited

U.S. PATENT DOCUMENTS 9,224,752 B1    12/2015  Lee et al.
9,842,855 B2    12/2017  Lee
(Continued)

FOREIGN PATENT DOCUMENTS

CN    105374825 A    3/2016
CN    106856197 A    6/2017
(Continued)

*Primary Examiner* — Jesse Y Miyoshi
(74) *Attorney, Agent, or Firm* — WILLIAM PARK & ASSOCIATES LTD.

(57) ABSTRACT

A vertical semiconductor device includes: a lower structure; a multi-layer stack structure including a source layer formed over the lower structure and gate electrodes formed over the source layer; a vertical structure penetrating the multi-layer stack structure and including a channel layer insulated from the source layer; a vertical source line spaced apart from the vertical structure to penetrate the multi-layer stack structure and contacting the source layer; and a horizontal source channel contact suitable for coupling the source layer and the channel layer and including a first conductive layer and a second conductive layer that include different dopants.

14 Claims, 12 Drawing Sheets

(51) Int. Cl.
  *H01L 21/768*  (2006.01)
  *H01L 23/532*  (2006.01)
  *H01L 23/535*  (2006.01)
  *H10B 41/27*   (2023.01)

(52) U.S. Cl.
  CPC .. *H01L 21/76823* (2013.01); *H01L 21/76834* (2013.01); *H01L 21/76895* (2013.01); *H01L 23/53271* (2013.01); *H01L 23/535* (2013.01); *H10B 41/27* (2023.02)

(56) References Cited

U.S. PATENT DOCUMENTS

| | | |
|---|---|---|
| 9,997,534 B2 | 6/2018 | Son et al. |
| 10,916,556 B1 * | 2/2021 | Sakakibara ............ H10B 43/40 |
| 11,430,800 B2 * | 8/2022 | Kim ....................... H10B 41/10 |
| 2016/0268263 A1 | 9/2016 | Lee et al. |
| 2018/0006052 A1 | 1/2018 | Hwang |
| 2018/0261671 A1 | 9/2018 | Matsumoto et al. |
| 2018/0374866 A1 | 12/2018 | Makala et al. |
| 2019/0326315 A1 | 10/2019 | Lee et al. |

FOREIGN PATENT DOCUMENTS

| | | | |
|---|---|---|---|
| CN | 107293544 A | | 10/2017 |
| CN | 109449160 A | | 3/2019 |
| KR | 1020110029403 A | | 3/2011 |
| KR | 1020170090387 A | | 8/2017 |
| KR | 1020180135526 A | | 12/2018 |

\* cited by examiner

VERTICAL SEMICONDUCTOR DEVICE AND METHOD FOR FABRICATING THE VERTICAL SEMICONDUCTOR DEVICE

CROSS-REFERENCE TO RELATED APPLICATIONS

The present application is a continuation application of U.S. patent application Ser. No. 17/567,423, filed on Jan. 3, 2022, which is a continuation application of U.S. patent application Ser. No. 16/680,219, filed on Nov. 11, 2019, and claims priority under 35 U.S.C. § 119(a) to Korean Patent Application No. 10-2019-0042570, filed on Apr. 11, 2019, in the Korean Intellectual Property Office, which is incorporated herein by reference in its entirety.

BACKGROUND

1. Technical Field

Various embodiments generally relate to a semiconductor device, and more particularly, to a vertical semiconductor device and a method for fabricating the vertical semiconductor device.

2. Related Art

In the manufacturing of electronic devices, such as semiconductor devices, a gap-fill process is required for a three-dimensional structure or a high aspect ratio structure. The gap-filling process of a high aspect ratio structure may be performed, for example, in the fabrication of vertical semiconductor devices.

SUMMARY

In accordance with an embodiment, a vertical semiconductor device may include: a lower structure; a multi-layer stack structure including a source layer formed over the lower structure and gate electrodes formed over the source layer; a vertical structure penetrating the multi-layer stack structure and including a channel layer insulated from the source layer; a vertical source line spaced apart from the vertical structure to penetrate the multi-layer stack structure and contacting the source layer; and a horizontal source channel contact coupling the source layer and a channel layer and including a first conductive layer and a second conductive layer that include different dopants.

In accordance with an embodiment, a method for fabricating a vertical semiconductor device may include: forming a first multi-layer stack in which a source sacrificial layer is positioned over a lower source layer, the lower source layer over a lower structure; forming a second multi-layer stack in which dielectric layers and sacrificial layers are alternately stacked over the first multi-layer stack; forming a vertical structure that penetrates the second multi-layer stack and the first multi-layer stack, and includes a channel layer insulated from the lower source layer; forming a vertical contact recess that penetrates the second multi-layer stack and the first multi-layer stack and exposes the source sacrificial layer; forming a horizontal contact recess extending from the vertical contact recess by removing the source sacrificial layer; exposing a side of the channel layer of the vertical structure by extending the horizontal contact recess; and forming a source channel contact that fills the horizontal contact recess, and includes a first doped layer in contact with the channel layer and a second doped layer doped with a dopant which is different from a dopant of the first doped layer.

DETAILED DESCRIPTION

Figure 1:
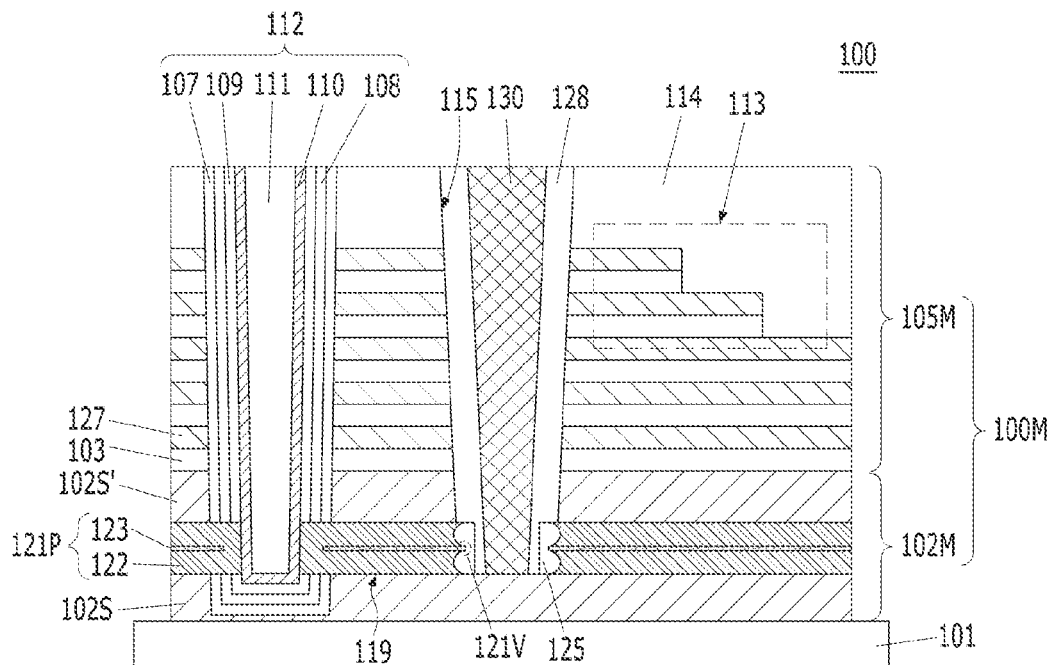
FIG. 1 is a cross-sectional view illustrating a vertical semiconductor device in accordance with an embodiment.

Various embodiments will be described below with reference to the accompanying drawings. The examples, however, be embodied in different forms and should not be construed as limited to the embodiments set forth herein. Rather, these embodiments are provided so that this disclosure will be thorough and complete. Throughout the disclosure, like reference numerals refer to like parts throughout the various figures and embodiments.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the following embodiments, a high aspect ratio structure may include a three-dimensional structure. The high aspect ratio structure may include a vertical structure, a horizontal structure, or a combination thereof. The high aspect ratio structure may refer to a contact hole, a trench, a recess, or an opening. The high aspect ratio structure may have a height-to-width ratio of at least 5:1 or greater.

The following embodiments to be described below may be used to gap-fill the horizontal high aspect ratio structure of a vertical semiconductor device, such as a vertical NAND.

Embodiments may be directed to a gap-filling method that allows a high aspect ratio structure to be gap-filled without voids.

Embodiments may be directed to a vertical semiconductor device capable of improving reliability and a method for fabricating the vertical semiconductor device.

FIG. 1 is a cross-sectional view illustrating a vertical semiconductor device in accordance with an embodiment.

Referring to FIG. 1, the vertical semiconductor device 100 may include a lower structure 101 and a multi-layer stack structure 100M formed over the lower structure 101. The multi-layer stack structure 100M may include a lower stack 102M formed over the lower structure 101 and an upper stack 105M formed over the lower stack 102M. The multi-layer stack structure 100M may further include an inter-layer dielectric layer 114 formed over the upper stack 105M.

The lower stack 102M may include source layers 102S and 102S' and a source channel contact 121P. The source layers 102S and 102S' may include a lower source layer 102S and an upper source layer 102S'. The source channel contact 121P may be formed between the lower source layer 102S and the upper source layer 102S'. The lower source layer 102S and the upper source layer 102S' may be of the same material. They may include a semiconductor material such as polysilicon. The source channel contact 121P may include a semiconductor material such as polysilicon. The source channel contact 121P may fill the horizontal contact recess 119. The source channel contact 121P may be referred to as a horizontal source channel contact 121P.

The source channel contact 121P may include a first conductive layer 122 and a second conductive layer 123. The first conductive layer 122 and the second conductive layer 123 may have different wet etch rates. The first conductive layer 122 and the second conductive layer 123 may include different dopants. The first conductive layer 122 and the second conductive layer 123 may have a wet etch rate difference by different dopants. The first conductive layer 122 may include a first dopant, and the second conductive layer 123 may include a second dopant. The first dopant may include phosphorus, and the second dopant may include carbon. The first conductive layer 122 may include a phosphorus-doped polysilicon. The second conductive layer 123 may include carbon-doped polysilicon.

The upper stack 105M may include an alternating stack in which dielectric layers 103 and gate electrodes 127 are alternately stacked. The dielectric layers 103 may include silicon oxide, and the gate electrodes 127 may include a metal-based material. The gate electrodes 127 may include a stack of tungsten or titanium nitride and tungsten. A step structure 113 may be formed at one end of the gate electrodes 127. The step structure 113 may include a plurality of steps, and each step may include a pair comprising of a gate electrode 127 and a dielectric layer 103.

A vertical structure 112 penetrating the multi-layer stack structure 100M may be formed. The bottom surface of the vertical structure 112 may extend to contact the lower source layer 102S. The vertical structure 112 may include a blocking layer 107, a charge storage layer 108, a tunnel dielectric layer 109, and a channel layer 110. The blocking layer 107 may be in direct contact with the gate electrodes 127. The vertical structure 112 may further include a core dielectric layer 111 that is formed over the channel layer 110.

In the lower portion of the vertical structure 112, the channel layer 110 may be in direct contact with the source channel contact 121P. To this end, the blocking layer 107, the charge storage layer 108, and the tunnel dielectric layer 109 may be selectively removed from the lower portion of the vertical structure 112.

A source line 130 may be formed to be spaced apart from the vertical structure 112 and penetrate the multi-layer stack structure 100M. A sealing spacer 128 may be formed between the source line 130 and the gate electrodes 127. The source line 130 may be in direct contact with the lower source layer 102S. The source channel contact 121P and the upper source layer 102S' might not be in contact with the source line 130. The source line 130 may include a stack of tungsten or polysilicon and tungsten. The source line 130 may fill the vertical contact recess 115. The source line 130 may be referred to as a vertical source line. The vertical contact recess 115 and the horizontal contact recess 119 may be coupled to each other. The sealing spacer 128 may be formed on the side wall of the vertical contact recess 115.

A barrier oxide 125 may be formed at one end of the source channel contact 121P. The barrier oxide 125 may be formed between the source channel contact 121P and a sealing spacer 128. The barrier oxide 125 may be an oxide that oxidizes the source channel contact 121P. The barrier oxide 125 may include silicon oxide.

One end of the source channel contact 121P may include a concave portion and a convex portion. The convex portion of the source channel contact 121P may have a peak 121V. The peak 121V may be obtained by the wet etch rate difference between the first conductive layer 122 and the second conductive layer 123. The peak 121V may be provided by the second conductive layer 123. In an embodiment, the second conductive layer 123 includes a material having a slower wet etch rate than the first conductive layer 122.

Even though the peak 121V is formed, the surface of the barrier oxide 125 may be uniform. That is, the surface roughness of the barrier oxide 125 opposed to the source line 130 may be planar.

FIGS. 2A to 2I are cross-sectional views illustrating a method for fabricating a vertical semiconductor device in accordance with an embodiment.

Figure 2A:
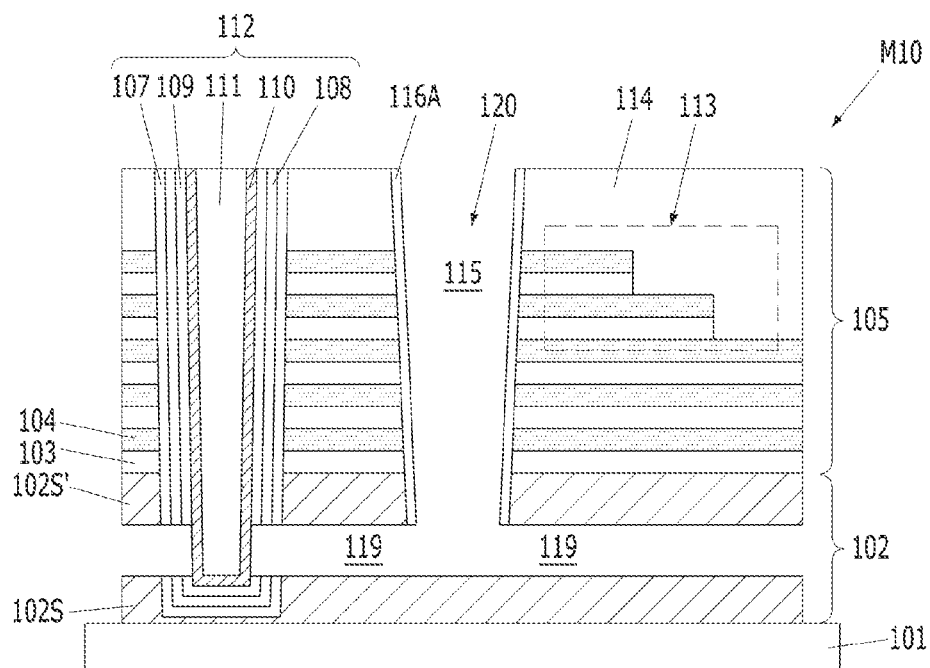
FIGS. 2A to 2I are cross-sectional views illustrating a method for fabricating a vertical semiconductor device in accordance with an embodiment.

Referring to FIG. 2A, a gap-fill target structure M10 may be formed over the lower structure 101. The gap-fill target structure M10 may include a first multi-layer stack 102 and a second multi-layer stack 105 over the first multi-layer stack 102. The gap-fill target structure M10 may include a source contact opening 120 that penetrates the second multi-layer stack 105 and the first multi-layer stack 102. The source contact opening 120 may include a vertical contact recess 115 and a horizontal contact recess 119. The horizontal contact recess 119 may extend from the vertical contact recess 115. The vertical contact recess 115 may extend in a direction perpendicular to the lower structure 101, and the horizontal contact recess 119 may extend in a direction horizontal with respect to the lower structure 101. The gap-fill target structure M10 may further include the vertical structure 112 penetrating the second multi-layer stack 105 and the first multi-layer stack 102.

Hereinafter, a method for forming the gap-fill target structure M10 will be described with reference to FIGS. 3A to 3J.

Figure 3A:
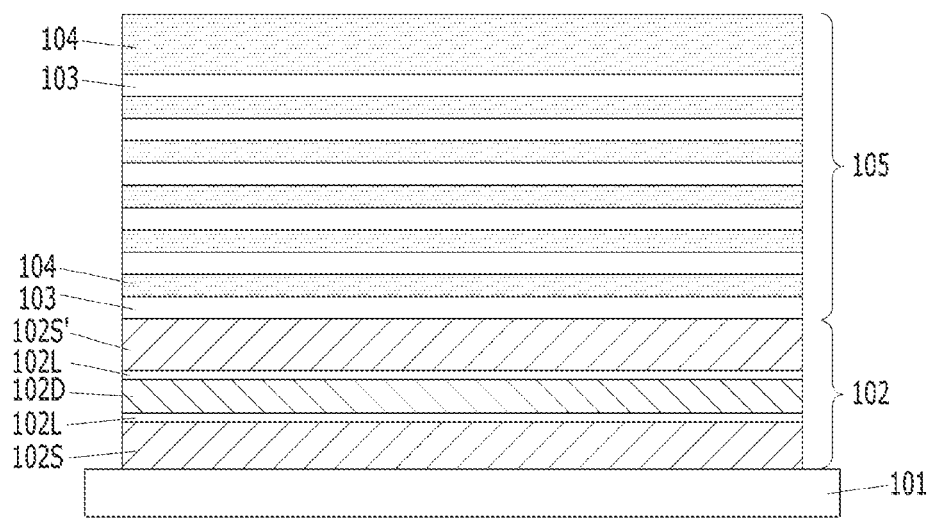
FIGS. 3A to 3J are cross-sectional views illustrating a method for forming a gap-fill target structure M10.

Referring to FIG. 3A, the first multi-layer stack 102 may be formed over the lower structure 101. The first multi-layer stack 102 may be a stack structure including the lower source layer 102S, the upper source layer 102S', the liner layers 102L, and a source sacrificial layer 102D. According to an embodiment, the first multi-layer stack 102 may have a source sacrificial layer 102D that is formed between the lower source layer 102S and the upper source layer 102S' and liner layers 102L that are formed between the source sacrificial layer 102D and the lower/upper source layers 102S and 102S'. The lower source layer 102S, the upper source layer 102S' and the source sacrificial layer 102D may be of the same material, and the liner layers 102L may be formed of a material different from those of the lower source layer 102S, the upper source layer 102S' and the source sacrificial layer 102D. The lower and upper source layers 102S and 102S' may have an etch selectivity to the liner layers 102L. The lower source layer 102S, the upper source layer 102S', and the source sacrificial layer 102D may include a semiconductor material, and the liner layers 102L may include a dielectric material. The lower source layer 102S, the upper source layer 102S', and the source sacrificial layer 102D may include polysilicon, and the liner layers 102L may include silicon oxide. The liner layers 102L may be thinner than the lower source layer 102S, the upper source layer 102S', and the source sacrificial layer 102D. For example, the lower source layer 102S and the upper source layer 102S' may have a thickness of approximately 150 nm, and the liner layers 102L may have a thickness of approximately 8 nm. The source sacrificial layer 102D may have the same thickness or may have a thinner thickness than the lower source layer 102S and the upper source layer 102S'.

Subsequently, a second multi-layer stack 105 may be formed over the first multi-layer stack 102. The second multi-layer stack 105 may be thicker than the first multi-layer stack 102. The second multi-layer stack 105 may include a dielectric layer 103 and a sacrificial layer 104. The second multi-layer stack 105 may include an alternating stack of the dielectric layer 103 and the sacrificial layer 104. The dielectric layer 103 and the sacrificial layer 104 may be alternately stacked alternately several times. The dielectric layer 103 and the sacrificial layer 104 may be of different materials. The dielectric layer 103 may have an etch selectivity to the sacrificial layer 104. The dielectric layer 103 may include silicon oxide, and the sacrificial layer 104 may include silicon nitride. The dielectric layer 103 and the sacrificial layer 104 may be of the same thickness. The dielectric layer 103 and the sacrificial layer 104 may be thicker than the liner layers 102L, and the dielectric layer 103 and the sacrificial layer 104 may be thinner than the lower source layer 102S and the upper source layer 102S'.

The dielectric layer 103 and the sacrificial layer 104 may be formed by using Chemical Vapor Deposition (CVD) or Atomic Layer Deposition (ALD). The sacrificial layer 104 formed at the top may be attacked and damaged by the subsequent processes. Therefore, the uppermost sacrificial layer 104 may be formed thicker than the other sacrificial layer 104 under the uppermost sacrificial layer 104. The uppermost sacrificial layer 104 may be used as an etch barrier.

Figure 3B:
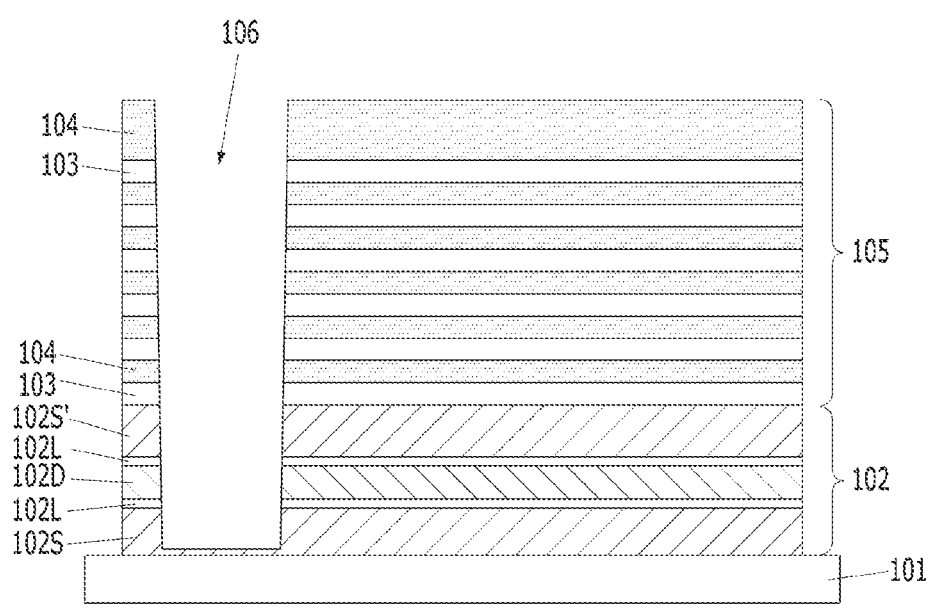

Referring to FIG. 3B, a vertical opening 106 may be formed. The vertical opening 106 may be formed by etching the second multi-layer stack 105 and the first multi-layer stack 102.

The vertical opening 106 may be formed perpendicular to the surface of the lower structure 101. The vertical opening 106 may be shaped to penetrate the first multi-layer stack 102 and the second multi-layer stack 105. Although not illustrated, from the perspective of a plan view, a plurality of vertical openings 106 may be formed and may have a hole array structure. When the vertical opening 106 is formed, the surface of the lower structure 101 might not be exposed. For example, a portion of the lower source layer 102S may remain below the bottom of the vertical opening 106. According to another embodiment, the vertical opening 106 may be referred to as a 'vertical recess, a vertical hole, or a channel hole'.

Figure 3C:
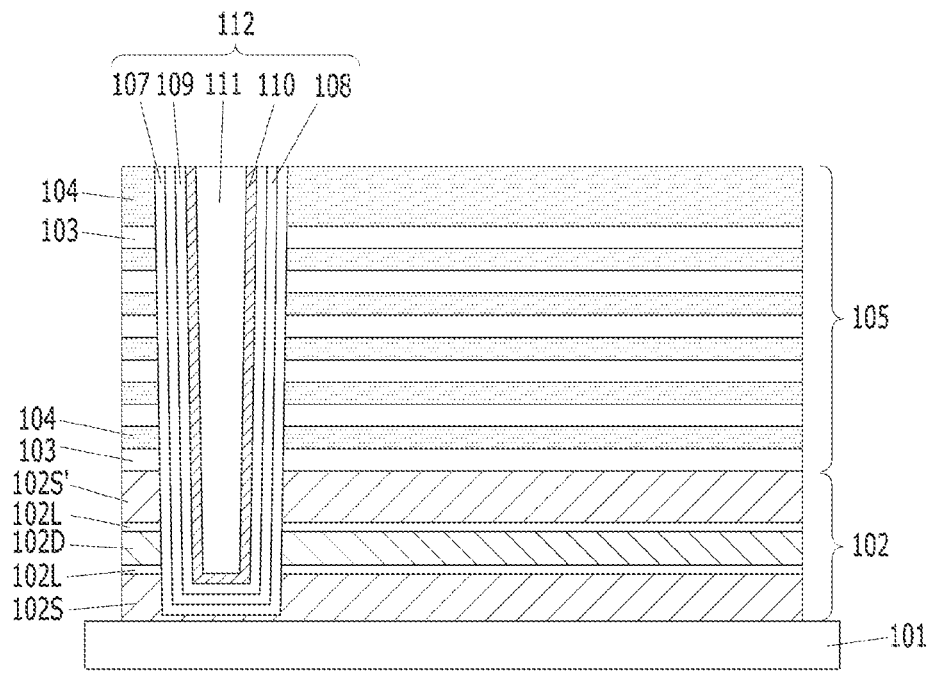

Referring to FIG. 3C, a vertical structure 112 may be formed in the vertical opening 106. The vertical structure 112 may fill the vertical opening 106. The vertical structure 112 may be referred to as a 'pillar structure'.

The vertical structure 112 may include a blocking layer 107, a charge storage layer 108, a tunnel dielectric layer 109, and a channel layer 110. The vertical structure 112 may include an ONOP structure. The ONOP structure may include a stack of oxide, nitride, oxide, and polysilicon layers. The blocking layer 107 and the tunnel dielectric layer 109 may include an oxide, and the charge storage layer 108 may include a nitride, and the channel layer 110 may include a polysilicon layer. According to an embodiment, the blocking layer 107 may include a high-k material, and the high-k material may include aluminum oxide or hafnium oxide.

The channel layer 110 may have a cylindrical shape having an inner space. The tunnel dielectric layer 109 may be formed on the outer wall of the channel layer 110, and the charge storage layer 108 may be formed on the outer wall of the tunnel dielectric layer 109. The blocking layer 107 may be formed on the outer wall of the charge storage layer 108.

The vertical structure 112 may further include a core dielectric layer 111. The inner space of the channel layer 110 may be completely filled with the core dielectric layer 111. The core dielectric layer 111 may include silicon oxide or silicon nitride.

Figure 3D:
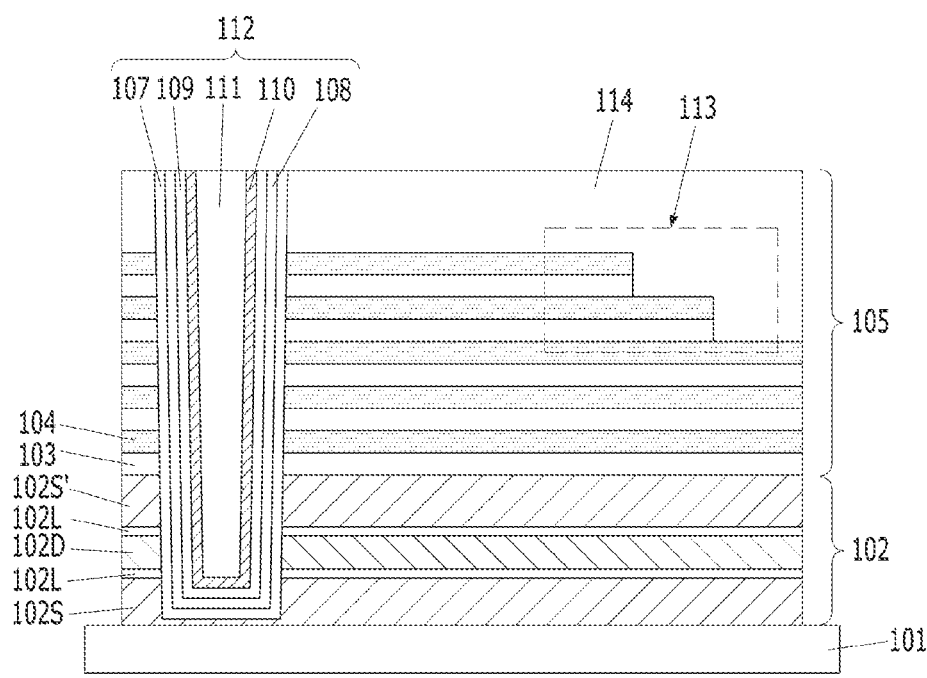

Referring to FIG. 3D, a step structure 113 including a plurality of steps may be formed. The step structure 113 may be formed by repeatedly performing an etch process of etching the second multi-layer stacks 105 by using a mask and a slimming process of a plurality of masks. The step structure 113 may be formed in a contact region, and the step structure 113 may be formed at one end of the second multi-layer stack 105.

Subsequently, the uppermost sacrificial layer 104 of the second multi-layer stack 105 may be removed. Then, an inter-layer dielectric layer 114 may be formed over the profile including the step structure 113. Subsequently, the inter-layer dielectric layer 114 may be planarized by a Chemical Mechanical Planarization (CMP) process, and the top surface of the vertical structure 112 may be exposed.

Although not illustrated, after the inter-layer dielectric layer 114 is formed, a slit may be formed. The slit may be formed in the contact region. The slit may function as a supporter of the contact area.

Figure 3E:
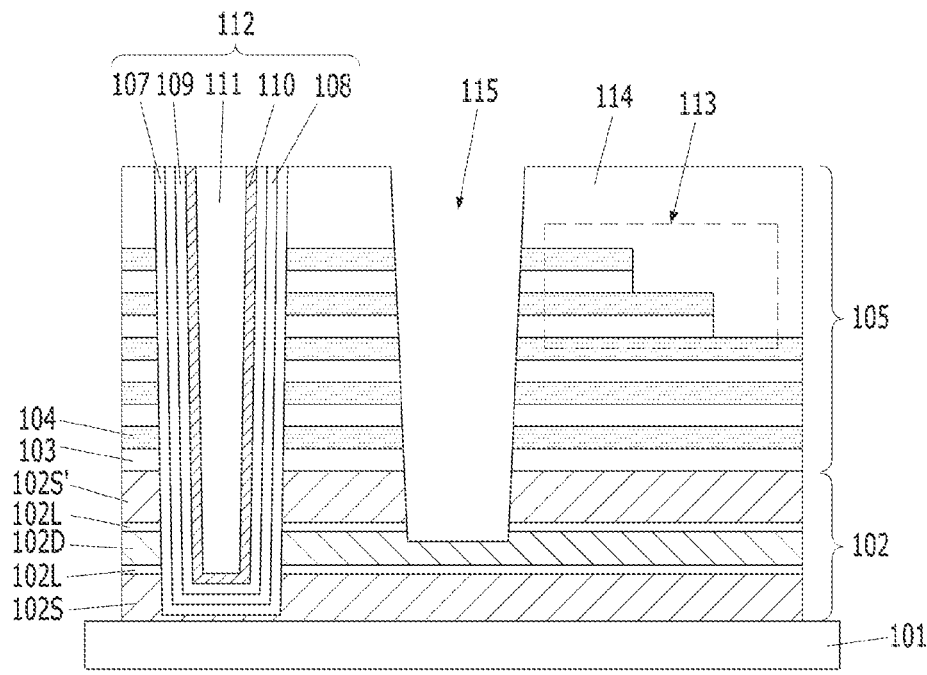

Referring to FIG. 3E, an initial vertical contact recess 115 may be formed. The initial vertical contact recess 115 may be formed between the vertical structure 112 and the step structure 113. The initial vertical contact recess 115 may be formed by etching the second multi-layer stack 105, and the initial vertical contact recess 115 may extend downward to a portion of the first multi-layer stack 102. The bottom surface of the initial vertical contact recess 115 may penetrate the upper source layer 102S' and the uppermost liner layer 102L. The etch process for forming the initial vertical contact recess 115 may stop above the source sacrificial layer 102D. The upper surface of the source sacrificial layer 102D may be partially recessed while the initial vertical contact recess 115 is formed. The initial vertical contact recess 115 may be referred to as a slit or trench. From the perspective of a top view, the initial vertical contact recess 115 may have a shape of a line extending in one direction.

The initial vertical contact recess 115 may have a high aspect ratio perpendicular to the surface of the lower structure 11.

Figure 3F:
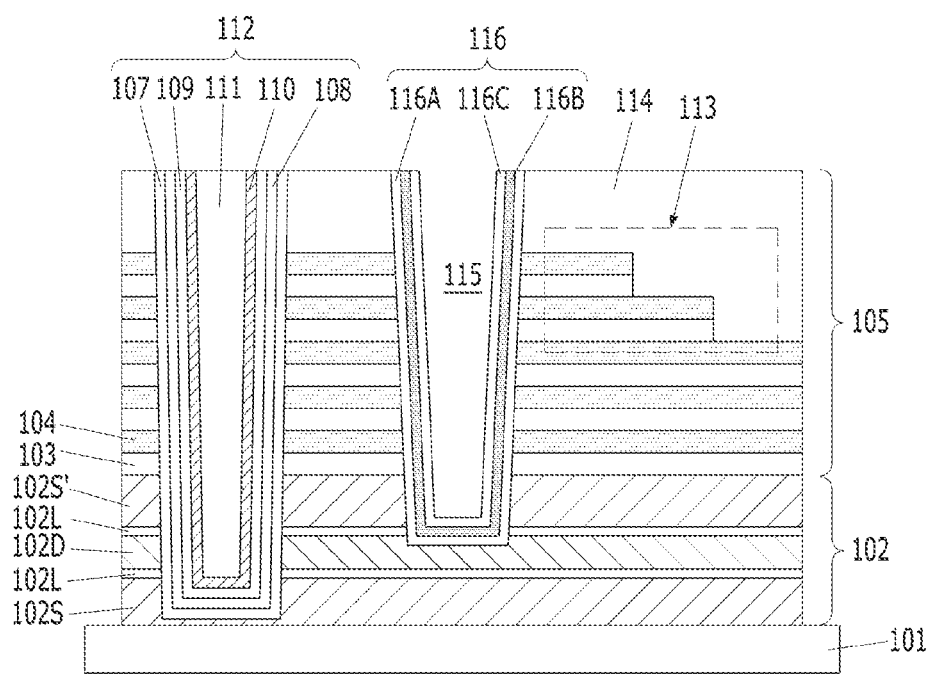

Referring to FIG. 3F, a sacrificial sealing layer 116 may be formed over the initial vertical contact recess 115. The sacrificial sealing layer 116 may include a first sealing layer 116A, a second sealing layer 116B, and a third sealing layer 116C. The first sealing layer 116A and the third sealing layer 116C may be of the same material, and the second sealing layer 116B may be of a material different from the materials of the first and third sealing layers 116A and 116C. The second sealing layer 116B may have an etch selectivity to the first and third sealing layers 116A and 116C. The first sealing layer 116A and the third sealing layer 1165C may include an oxide, and the second sealing layer 116B may include a nitride. Thus, the sacrificial sealing layer 116 may include a NON structure. The NON structure may refer to a stack of a nitride, an oxide, and a nitride. The bottom and side walls of the initial vertical contact recess 115 may be covered with the sacrificial sealing layer 116.

Figure 3G:
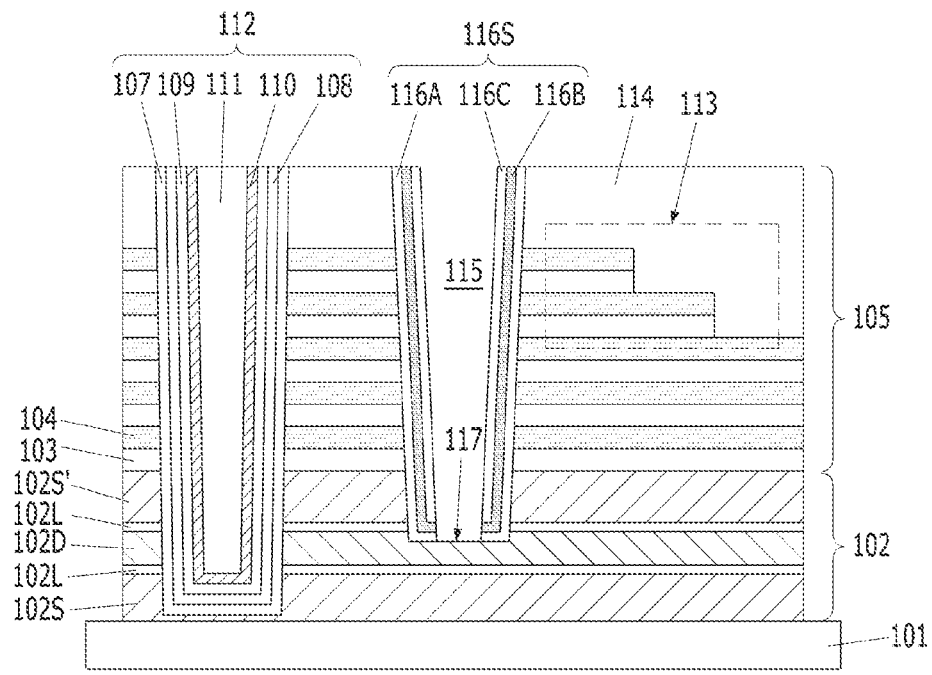

Referring to FIG. 3G, a cutting process 117 of the sacrificial sealing layer 116 may be performed. The cutting process 117 of the sacrificial sealing layer 116 may include an etch process, and the surface of the source sacrificial layer 102D may be exposed by the cutting process 117. After the cutting process 117 is performed, the sacrificial sealing layer 116 may remain as sacrificial spacers 116S on both side walls of the initial vertical contact recess 115. The cutting process 117 of the sacrificial sealing layer 116 may include an etch-back process.

Figure 3H:
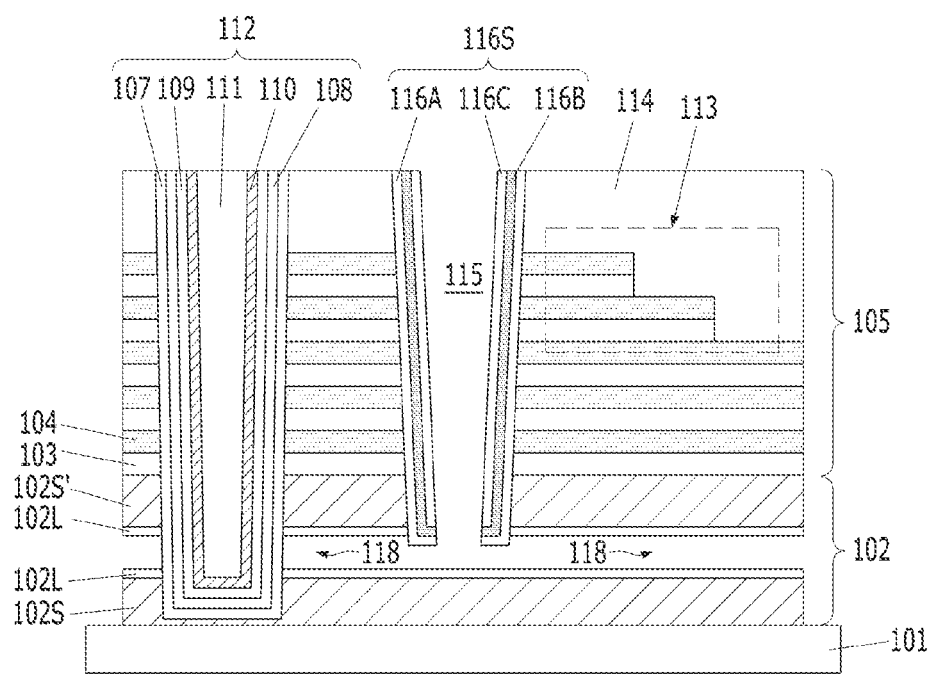

Referring to FIG. 3H, the source sacrificial layer 102D may be selectively removed through the initial vertical contact recess 115. As a result, an initial horizontal contact recess 118 may be formed. The initial vertical contact recess 115 and the initial horizontal contact recess 118 may be coupled to each other. The initial horizontal contact recesses 118 may be formed between the liner layers 102L by removing the source sacrificial layer 102D by a dip-out process. The initial horizontal contact 118 may be parallel to the surface of the lower structure 101. When the source sacrificial layer 102D is removed, the liner layers 102L having etch selectivity may remain unremoved. The initial horizontal contact recesses contact 118 may be formed in the first multi-layer stack 102. When the source sacrificial layer 102D is removed, the lower source layer 102S and the upper source layer 102S' might not be removed. A wet etch process may be applied to remove the source sacrificial layer 102D. Since the source sacrificial layer 102D includes a polysilicon layer, the wet etch process may be performed by using a chemical capable of etching the polysilicon layer.

A portion of the initial horizontal contact recess 118 may expose the side walls of the lower portion of the vertical structure 112. The outer wall of the vertical structure 112 may be the blocking layer 107, and the blocking layer 107 of the vertical structure 112 may be exposed by the initial horizontal contact recess 118. Since the blocking layer 107 contains an oxide, the blocking layer 107 of the vertical structure 112 having an etch selectivity might not be etched while the source sacrificial layer 102D is removed. From the perspective of a top view, the initial horizontal contact recess 118 may have a shape of surrounding the side walls of the lower portion of the vertical structure 112.

Figure 3I:
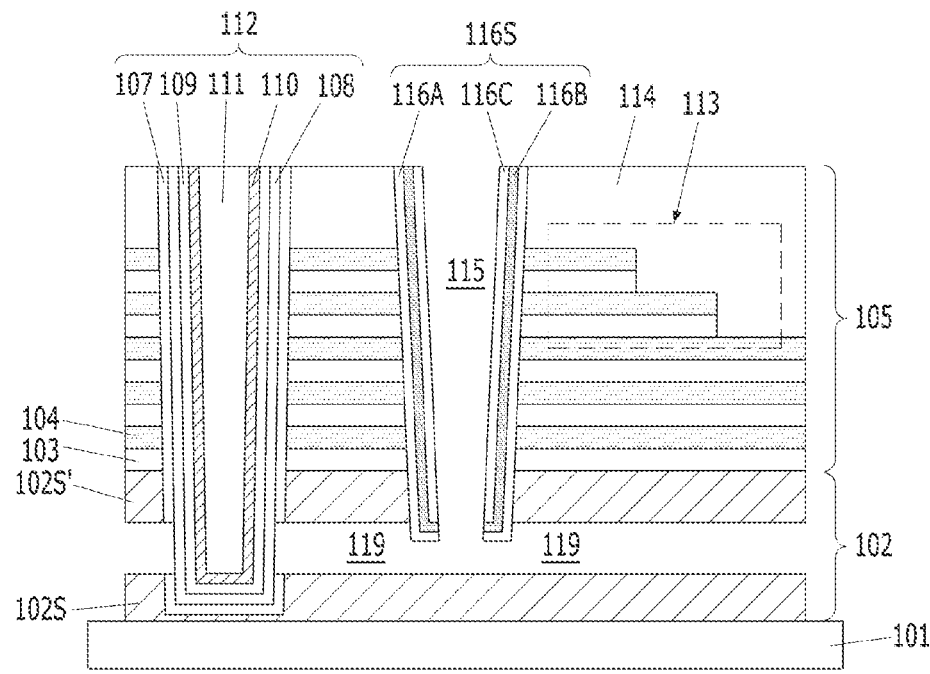

Referring to FIG. 3I, the liner layers 102L may be removed. Thus, the height of the initial horizontal contact recess 118 may be increased. The height-widened initial horizontal contact recess may be formed with a reference numeral 119. Hereinafter, the height-widened initial horizontal contact recess may be referred to as a horizontal contact recess 119.

While the liner layers 102L are removed, the blocking layer 107 of the vertical structure 112 may be removed. As a result, the charge storage layer 108 of the vertical structure 112 may be exposed. A wet etch process may be applied to remove the liner layers 102L. The wet etch process may be performed by using a chemical capable of selectively removing a silicon oxide.

Figure 3J:
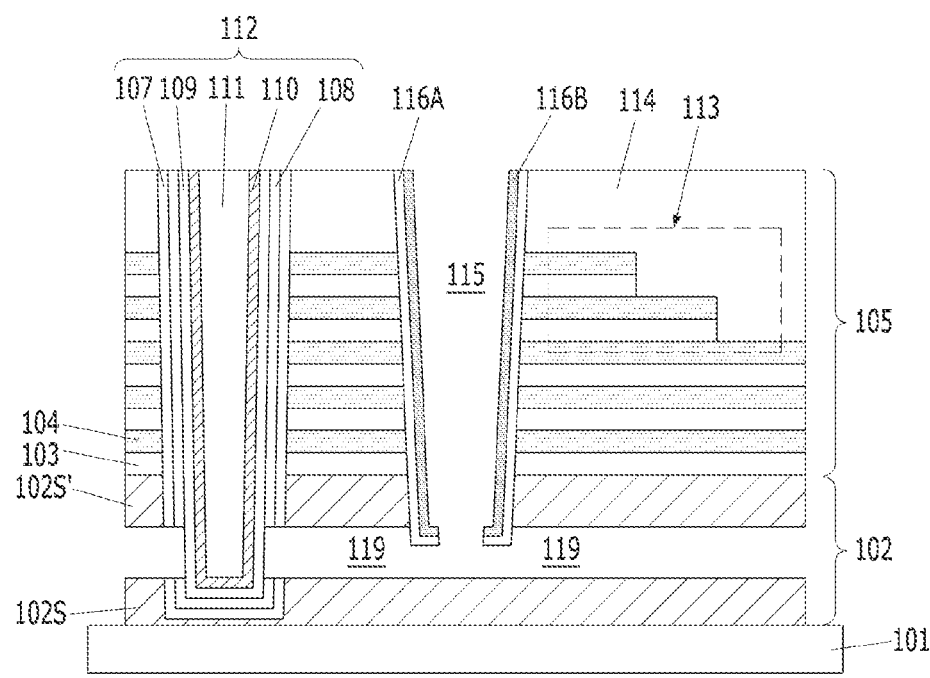

Referring to FIG. 3J, the charge storage layer 108 of the vertical structure 112 may be removed through the initial vertical contact recess 115 and the horizontal contact recess 119. When the charge storage layer 108 is removed, the third sealing layer 116C of the sacrificial spacer 116S may be removed. The charge storage layer 108 and the third sealing layer 116C may be removed by a wet etch process. Since the charge storage layer 108 and the third sealing layer 116C include a nitride, the wet etch process may use a chemical capable of etching the nitride.

The horizontal-direction length of the horizontal contact recess 119 may be increased by removing the charge storage layer 108. The horizontal-direction width of the initial vertical contact recess 115 may be increased by removing the third sealing layer 116C. Hereinafter, the widened initial vertical contact recess 115 may be referred to as a vertical contact recess 115.

The tunnel dielectric layer 109 of the vertical structure 112 may then be removed through the vertical contact recess 115 and the horizontal contact recess 119. While the tunnel dielectric layer 109 is removed, the second sealing layer 116B of the sacrificial spacer 116S may be removed. The tunnel dielectric layer 109 and the second sealing layer 116B may be removed by a wet etch process. Since the tunnel dielectric layer 109 and the second sealing layer 116B include an oxide, the wet etch process may use a chemical capable of etching the oxide.

The horizontal-direction length of the horizontal contact recess 119 may be increased by removing the tunnel dielectric layer 109. The horizontal-direction width of the vertical contact recess 115 may be increased by removing the second sealing layer 116B.

FIG. 2A shows a result after the tunnel dielectric layer 109 is removed. The first sealing layer 116A may remain on the side walls of the vertical contact recess 115. The horizontal contact recess 119 may extend from the vertical contact recess 115.

The initial vertical contact recess 115 and the initial horizontal contact recess 118 may be respectively widened by a series of processes as described above.

As described above, the source contact openings 120 penetrating the first multi-layer stack 102 and the second multi-layer stack 105 may be formed by the series of the processes shown in FIGS. 3A to 3J. The source contact openings 120 may include the vertical contact recess 115 and the horizontal contact recess 119. The horizontal contact recess 119 may extend from the vertical contact recess 115. The vertical contact recess 115 may extend in a direction perpendicular to the lower structure 101, and the horizontal contact recess 119 may extend in a horizontal direction with respect to the lower structure 101. The horizontal contact recess 119 may have a high aspect ratio that is parallel to the surface of the lower structure 101. The vertical contact recess 115 may have a high aspect ratio perpendicular to the lower structure 101.

Figure 2B:
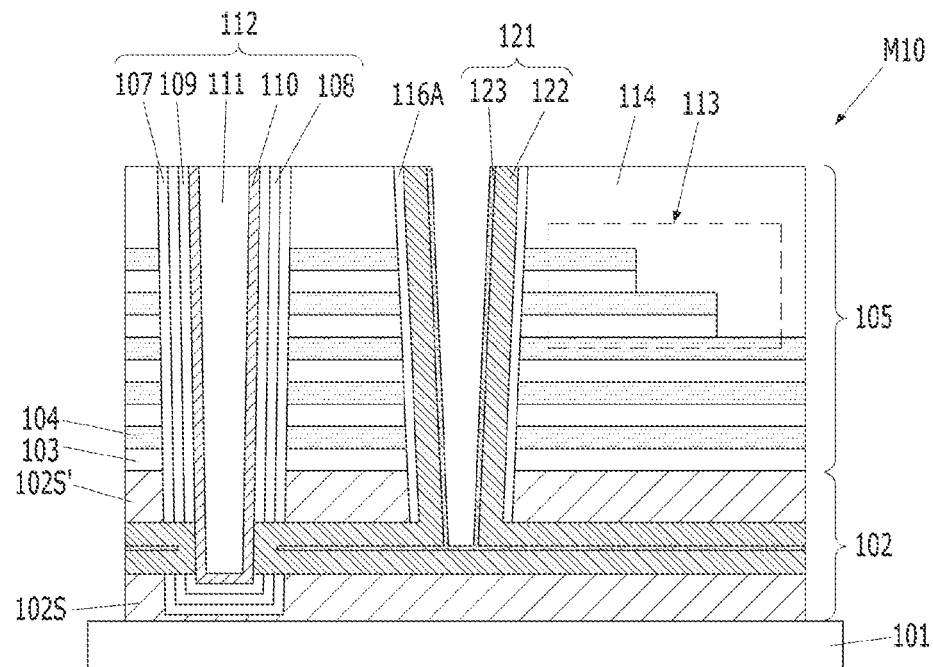

Referring to FIG. 2B, a conductive layer 121 may be formed over the gap-fill target structure M10 including the source contact openings 120. The conductive layer 121 may include a first conductive layer 122 and a second conductive layer 123 that are sequentially stacked. The first conductive layer 122 may include a first dopant, and the second conductive layer 123 may include a second dopant. The first dopant and the second dopant may be different materials. For example, the first conductive layer 122 may include phosphorus (P), and the second conductive layer 123 may include carbon. The first conductive layer 122 and the second conductive layer 123 may be deposited in situ. The first conductive layer 122 may include phosphorus-doped polysilicon (SiP), and the second conductive layer 123 may include a carbon-doped polysilicon (SiC).

The wet etch rate of carbon-doped polysilicon (SiC) may be lower than the wet etch rate of the phosphorus-doped polysilicon (SiP). For example, the wet etch rate of the carbon-doped polysilicon (SiC) may be ⅕ slower than the wet etch rate of the phosphorus-doped polysilicon (SiP). The difference in the wet etch rate may improve the etch profile of the conductive layer 121. For example, when the conductive layer 121 is formed only of the phosphorus-doped polysilicon (SiP), lateral cutting of a V shape may occur after the conductive layer 121 is etched. On the other hand, when the conductive layer 121 is formed of two layers of the carbon-doped polysilicon (SiC) and the phosphorus-doped polysilicon (SiP), the lateral cutting after the etching of the conductive layer 121 may be prevented. Also, when the conductive layer 121 is formed of two layers of the carbon-doped polysilicon (SiC) and the phosphorus-doped polysilicon (SiP), a protruding shape may be formed after the conductive layer 121 is etched. The protruding shape may prevent less oxidation from the very source.

Figure 2C:
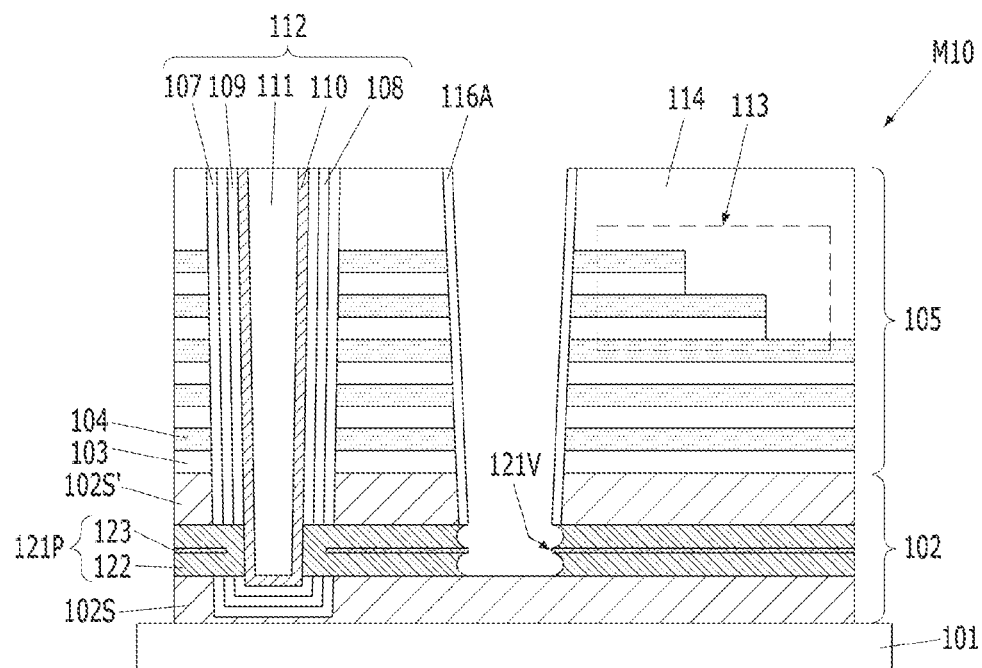

Referring to FIG. 2C, the conductive layer 121 may be selectively removed. The selective removal process of the conductive layer 121 may include a recessing process, and the recessing process may include wet etching. The source channel contact 121P may be formed in the horizontal contact recess 119 by the wet etching of the conductive layer 121. The source channel contact 121P may include a stack of a first conductive layer 122 and a second conductive layer 123. The etched surface of the source channel contact 121P may include a recess and a peak 121V without lateral cutting. The peak 121V may be provided by the second conductive layer 123, and the recess may be provided by the first conductive layer 122. When wet etching is performed on the conductive layer 121, the etch rate of the second conductive layer 123 may be slower than that of the first conductive layer 122. Therefore, the peak 121V may be formed.

Figure 2D:
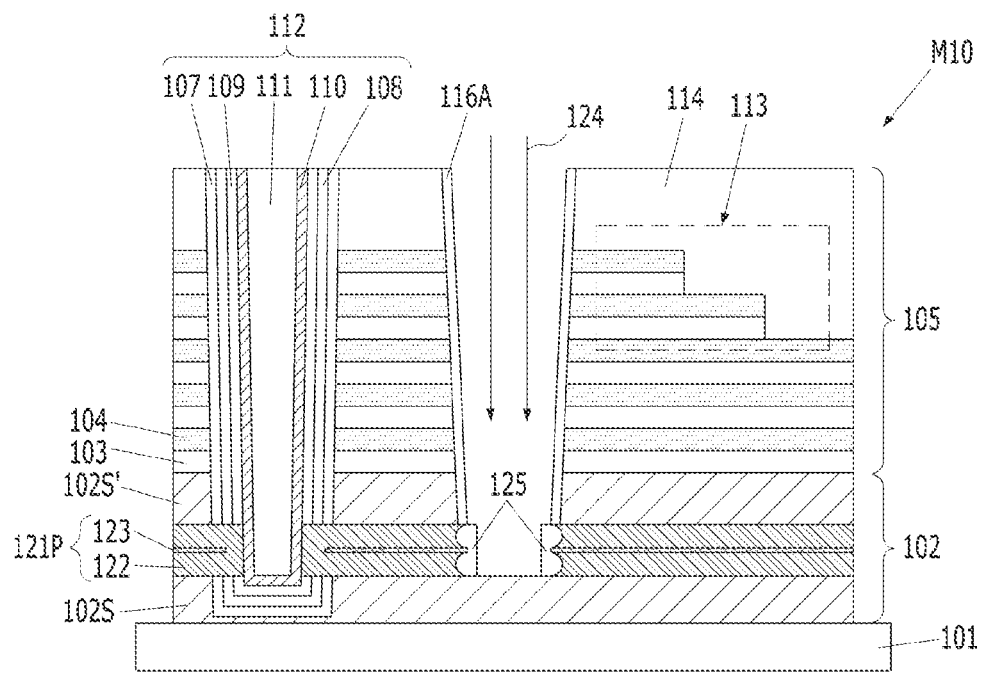

Referring to FIG. 2D, the source channel contact 121P may be exposed to an oxidation process 124. The oxidation process 124 may include dry oxidation or wet oxidation. The etched surfaces of the source channel contacts 121P may be oxidized by the oxidation process 124. Thus, a barrier oxide 125 may be formed at the end of the source channel contact 121P. The barrier oxide 125 may include silicon oxide.

The barrier oxide 125 may be formed with a stable thickness. Herein, the stable thickness may refer to a continuous thickness. For example, the stable thickness of the barrier oxide 125 may be a thickness that may protect the source channel contact 121P from being attacked during a subsequent process.

Meanwhile, when the source channel contact 121P is formed of only phosphorus-doped polysilicon (SiP), the barrier oxide 125 may be formed in a discontinuous thickness. In other words, even though the barrier oxide 125 is formed, the etched surface of the source channel contact 121P may be partially exposed.

Figure 2E:
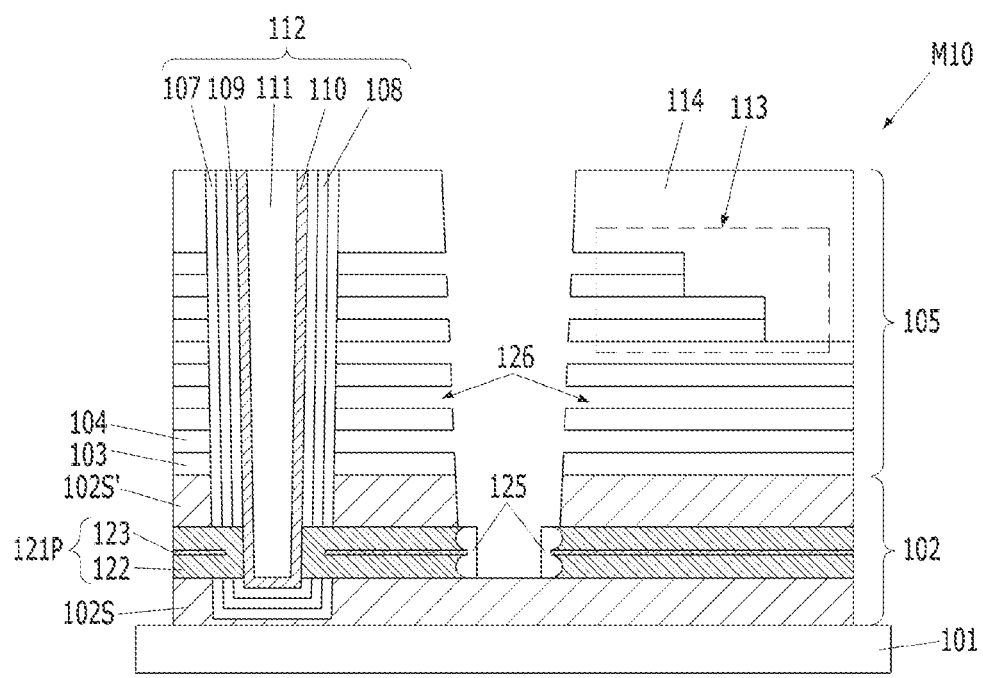

Referring to FIG. 2E, the sacrificial layer 104 of the second multi-layer stack 105 may be selectively removed. Accordingly, the horizontal gate recesses 126 between the dielectric layers 103 may be formed. Since the sacrificial layer 104 includes a nitride, the sacrificial layer 104 may be removed by a chemical containing phosphoric acid ($H_3PO_4$). When the sacrificial layer 104 is removed, the remaining first sealing layer 116A may also be removed at the same time.

During the removal of the sacrificial layer 104, the source channel contact 121P may be fully protected by the barrier oxide 125. The barrier oxide 125 may serve as a protective layer to protect the source channel contact 121P from being attacked.

Meanwhile, when the barrier oxide 125 is formed in a discontinuous thickness, the chemical may damage the source channel contact 121P. When the source channel contact 121P is damaged, there may be a problem in that the channel layer 110 of the vertical structure 112 may be broken.

Figure 2F:
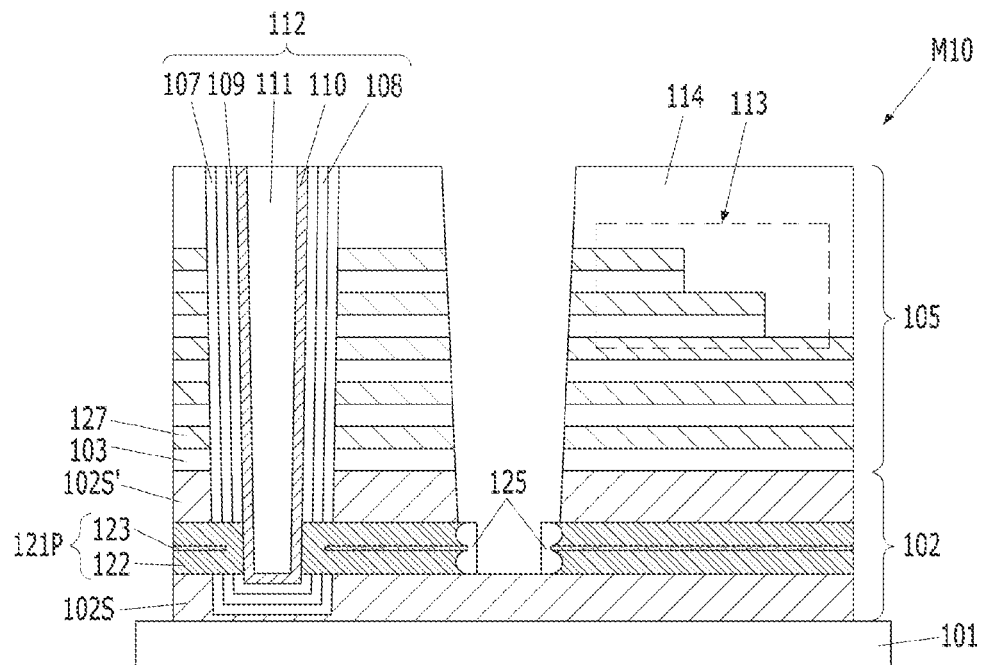

Referring to FIG. 2F, the gate electrodes 127 may fill the horizontal gate recesses 126. The gate electrodes 127 may be formed by depositing a conductive material to fill the horizontal gate recesses 126 and then performing an etch-back process. The gate electrodes 127 may include a low resistance material. The gate electrodes 127 may be a metal-based material. The gate electrodes 127 may include a metal, a metal silicide, a metal nitride, or a combination thereof. For example, the metal may include nickel, cobalt, platinum, titanium, tantalum or tungsten. The metal silicide may include nickel silicide, cobalt silicide, platinum silicide, titanium silicide, tantalum silicide or tungsten silicide. The gate electrodes 127 may include a stack of titanium nitride and tungsten.

Figure 2G:
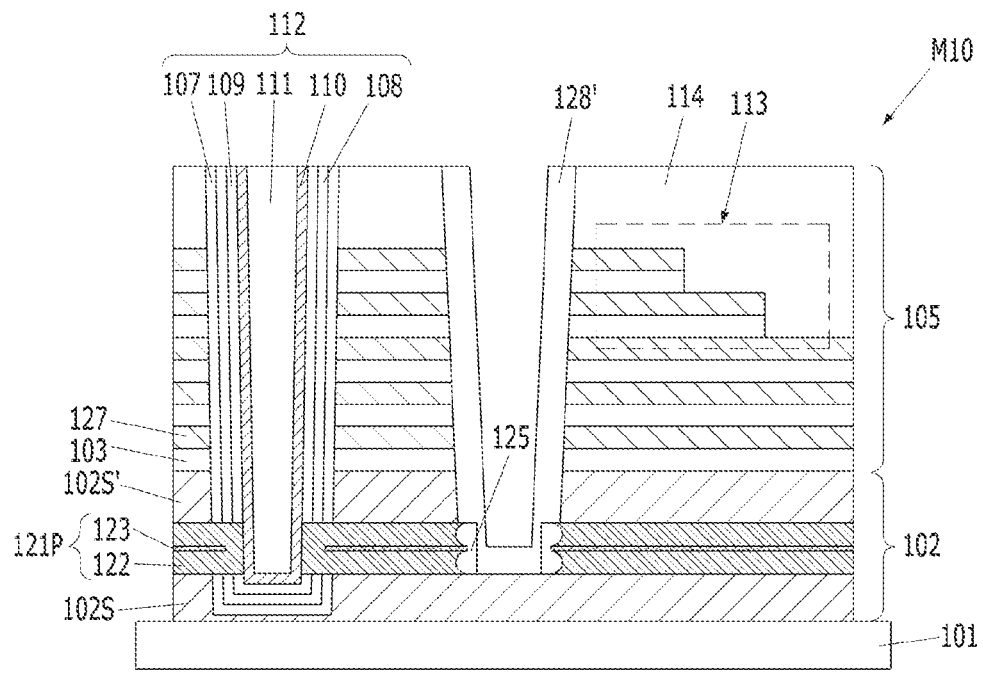

Referring to FIG. 2G, a sealing layer 128' may be formed. One end of one side of the gate electrodes 127 may be sealed. The sealing layer 128' may cover the barrier oxide 125. The sealing layer 128' may include silicon oxide or silicon nitride.

Figure 2H:
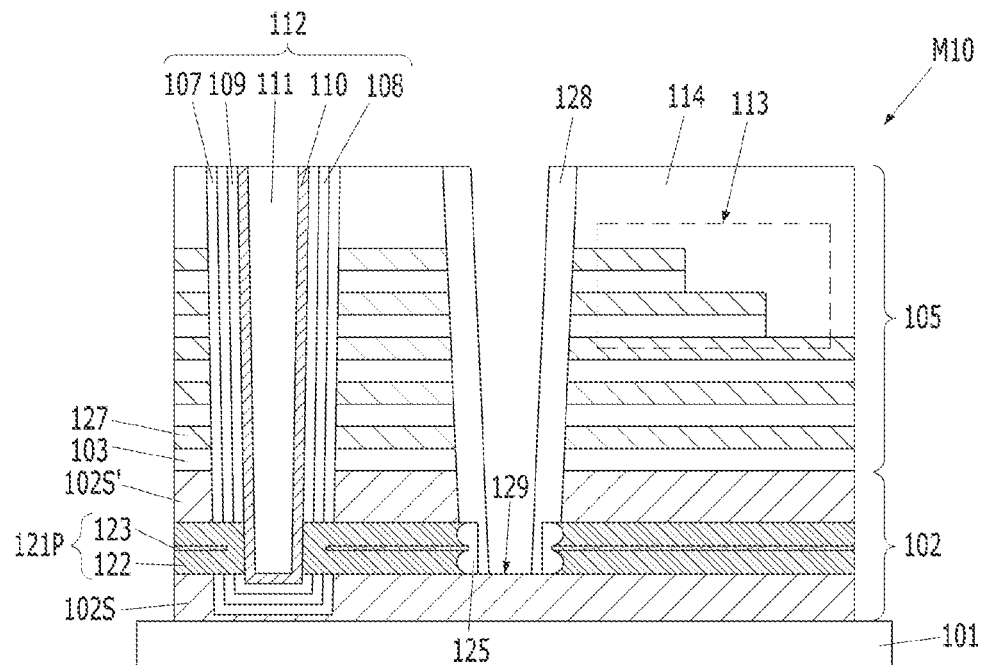

Referring to FIG. 2H, the sealing layer 128' may be selectively removed so that the surface of the lower source layer 102S is exposed (reference numeral 129'). Thus, a sealing spacer 128 may be formed on the side walls of the vertical contact recess 115. The bottom portion of the ceiling spacer 128 may completely cover the side walls of the barrier oxide 125.

Figure 2I:
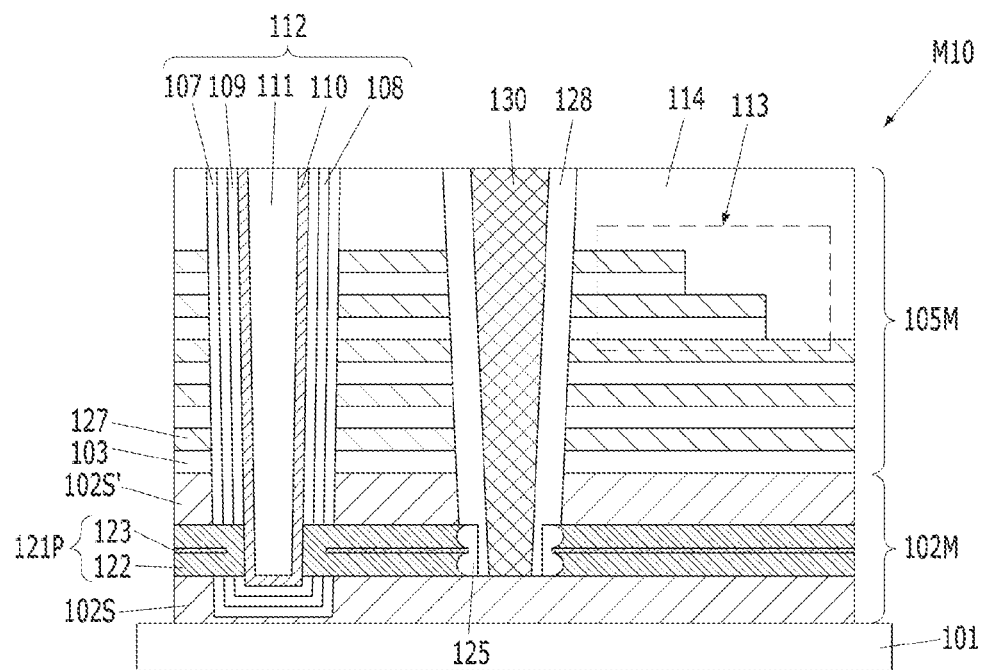

Referring to FIG. 2I, a source line 130 may be formed. The source line 130 may fill the vertical contact recess 115. The source line 130 may be a stack of polysilicon and tungsten. According to an embodiment, the source line 130 may be formed of tungsten.

As described above, the lower stack 102M and the upper stack 105M may be formed over the lower structure 101. The lower stack 102M may include source layers 102S and source channel contacts 121P. The upper stack 105M may be formed by alternately stacking the dielectric layers 103 and the gate electrodes 127. The vertical structure 112 may penetrate the upper stack 105M and the lower stack 102M. The lower portion of the channel layer 110 of the vertical structure 112 may directly contact the source channel contact 121P. The channel layer 110, the lower source layer 102S, and the source line 130 may be electrically coupled to each other through the source channel contact 121P.

According to the above description, in an embodiment, since the source channel contact 121P is formed by using the first conductive layer 122 and the second conductive layer 123 having different wet etch rates, it may be possible to remove a weak point that may cause less oxidation. Thus, the barrier oxide 125 may be formed with a stable thickness, and may protect the source channel contact 121P from being attacked by the subsequent process.

In addition, even though the source channel contact 121P is attacked not at its seam but at other points, the seam of the source channel contact 121P coupled to the channel layer 110 may be reinforced. Therefore, it may be possible to prevent defects that may occur due to discontinuous channel layer 110.

According to the embodiments described above, the carbon concentration of the second conductive layer 123 may be reduced to adjust the size and shape of the peak 121V.

FIGS. 4A to 4D are views for explaining a method of fabricating a vertical semiconductor device according to an example. The method of fabricating a vertical semiconductor device according to the example may be similar to the processes shown in FIGS. 2A to 2I. However, in the example, polysilicon having the same dopant may be deposited without applying polysilicon having a different dopant when the conductive layer 121 is deposited.

Figure 4A:
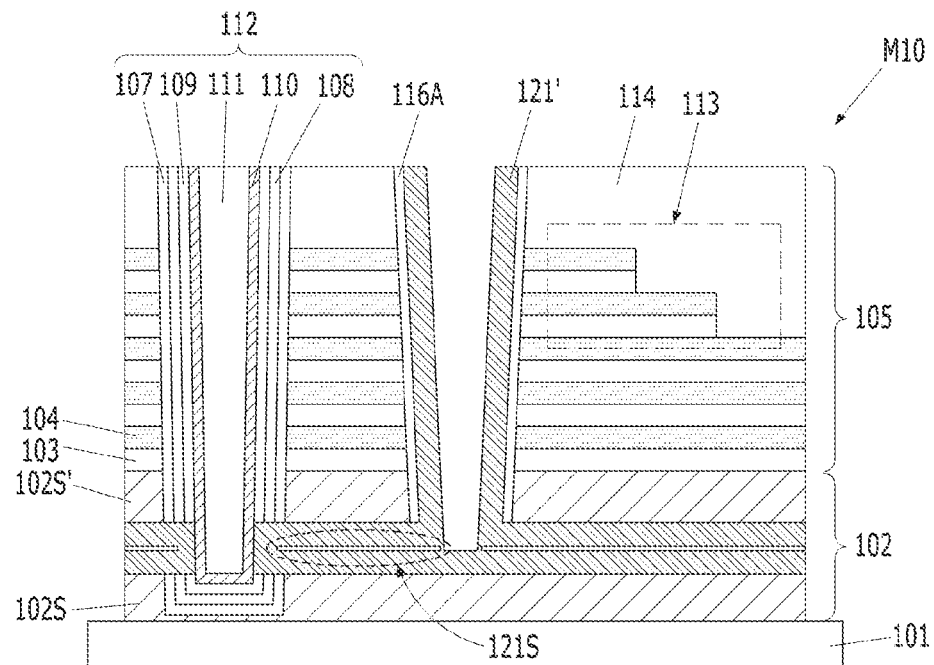
FIGS. 4A to 4D are cross-sectional views illustrating a method for fabricating a vertical semiconductor device according to an example.

Referring to FIG. 4A, a conductive layer 121' may be formed over the gap-fill target structure M10 including a vertical recess and a horizontal recess. The conductive layer 121' may be deposited with polysilicon having the same dopant. In the example, a seam 121S' may exist on the interface of polysilicon during deposition of the conductive layer 121'. The polysilicon with the same dopant may have the same wet etch rate. The conductive layer 121' may be formed of phosphorus-doped polysilicon.

Figure 4B:
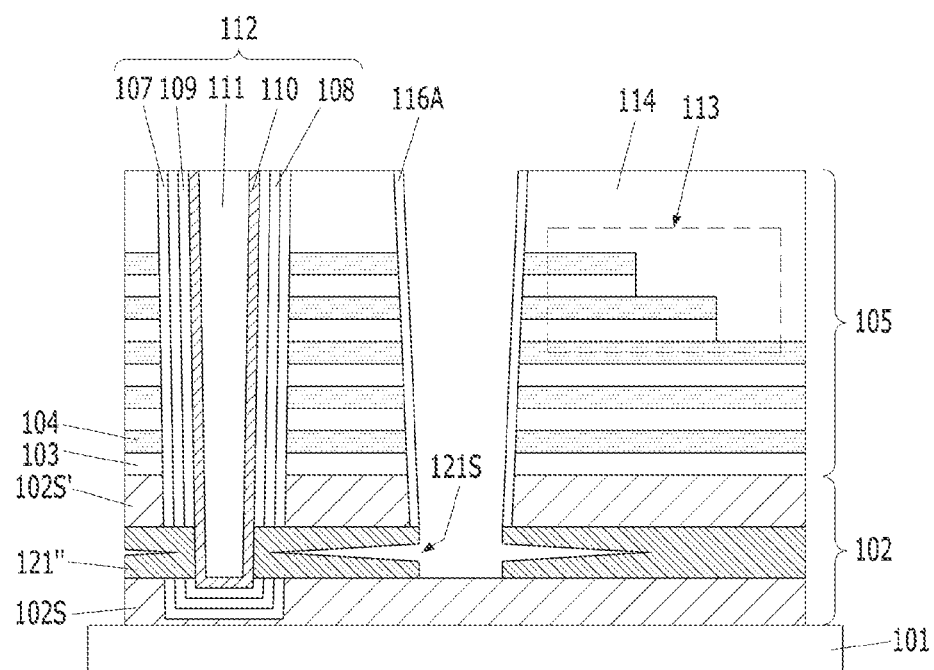

Subsequently, referring to FIG. 4B, the conductive layer 121' may be etched by a wet etch process to form a source channel contact 121". According to the example, an undercut 121S may be formed by the seam 121S' on the etched surface of the source channel contact 121". Such an undercut 121S may be generated by etching the conductive layer 121' having the same wet etch rate.

Figure 4C:
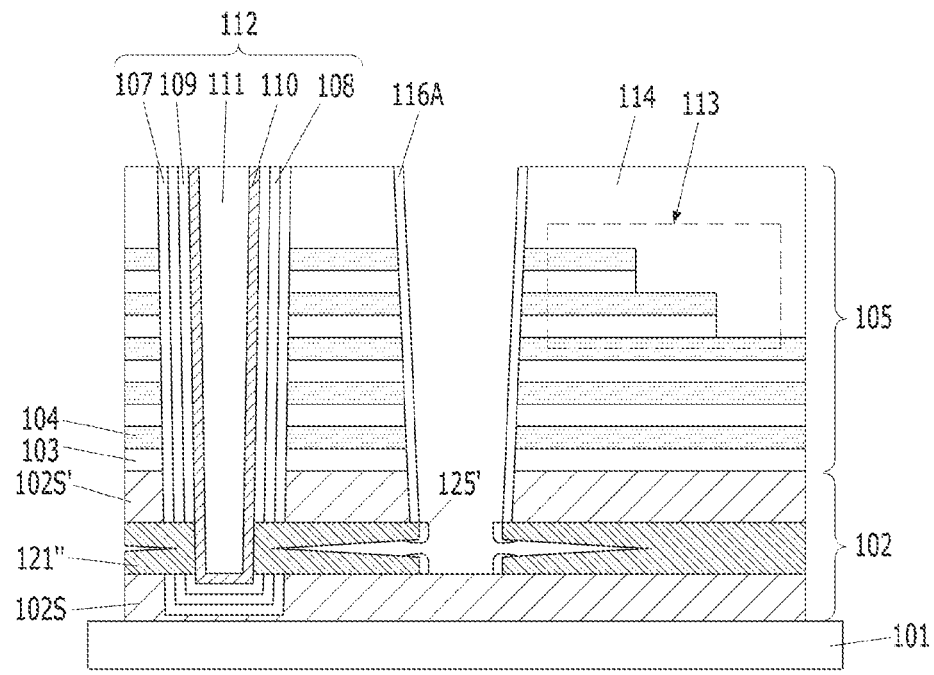

Referring to FIG. 4C, a barrier oxide 125' may be formed on the etched surface of the source channel contact 121". According to the example, the barrier oxide 125' may be formed in a discontinuous thickness. Thus, the source channel contact 121" may be attacked in the subsequent process because the barrier oxide 125' does not protect the undercut 121S.

Figure 4D:
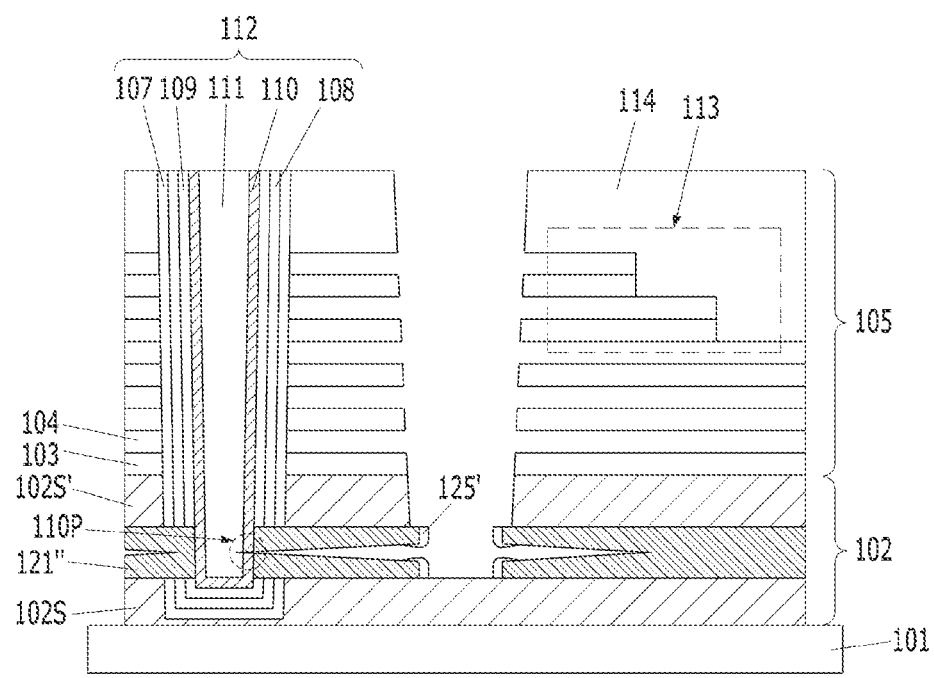

Referring to FIG. 4D, the sacrificial layers 103 may be removed. While the sacrificial layers 103 are removed, the source channel contact 121" may be damaged by the undercut 121S. When the source channel contact 121" is damaged, the channel layer 110 may be discontinuous 110P.

As described above, in the example, in the process of depositing the conductive layer 121', there may be interface between polysilicon, and the etch rate may be accelerated due to the presence of the seam 121S' that is formed on the interface of the polysilicon when the subsequent wet etch process is performed. As the wet etch process is performed rapidly, the undercut 121S may be formed in which the etch profile at the position of the seam penetrates into the inside. The undercuts 121S may cause instability in the oxidation process for forming the barrier oxide 125'.

After all, the surface energy of the undercut 121S may be increased, making the oxidized thickness thin, and the source channel contact 121" and the channel layer 110 may be damaged in the subsequent process.

According to the embodiments, horizontal recesses of a high aspect ratio may be filled with polysilicon containing different dopants without voids.

According to the embodiments, since polysilicon is formed with a difference in wet etch rates, an etched surface may be protected from being undercut.

According to the embodiments, the reliability of the vertical semiconductor device may be improved.

While the embodiments have been described with respect to the specific embodiments, it will be apparent to those skilled in the art that various changes and modifications may be made without departing from the spirit and scope of the description as defined in the following claims.

What is claimed is:

1. A vertical semiconductor device, comprising:
a lower stack including a source channel contact, wherein the source channel contact includes a first conductive layer and a second conductive layer;
an upper stack including a plurality of dielectric layers and a plurality of gate electrodes alternately stacked over the lower stack;
a channel layer penetrating the upper stack and extending in the lower stack, wherein the channel layer contact with the source channel contact; and
a barrier oxide formed on the first and second conductive layers of the source channel contact,
a vertical contact recess formed in the upper stack and extending to expose the barrier oxide; and
a sealing spacer formed on a side wall of the vertical contact recess and extending to cover the barrier oxide,
wherein the source channel contact includes a concave portion and a convex portion, the concave portion and the convex portion are directly contacted with the barrier oxide,
wherein the convex portion of the source channel contact has a peak, and the peak is provided by the second conductive layer, and
wherein the concave portion and the convex portion of the source channel contact are fully covered by the barrier oxide.

2. The vertical semiconductor device of claim 1, wherein the first conductive layer is positioned between the channel layer and the second conductive layer, and the first conductive layer has a shape surrounding the second conductive layer.

3. The vertical semiconductor device of claim 1, wherein the second conductive layer includes a material having a different wet etch rate than the first conductive layer.

4. The vertical semiconductor device of claim 1, wherein the first conductive layer includes polysilicon containing a first dopant, and the second conductive layer includes polysilicon containing a second dopant, where the first dopant and the second dopant are different materials.

5. The vertical semiconductor device of claim 1, wherein the second conductive layer includes carbon-doped polysilicon.

6. The vertical semiconductor device of claim 5, wherein the first conductive layer includes phosphorus-doped polysilicon.

7. The vertical semiconductor device of claim 1, wherein the second conductive layer has a thickness that is thinner than a thickness of the first conductive layer.

8. The vertical semiconductor device of claim 1, wherein the barrier oxide includes silicon oxide.

9. The vertical semiconductor device of claim 1, wherein the second conductive layer includes carbon-doped polysilicon, the first conductive layer includes phosphorus-doped polysilicon, and the barrier oxide includes silicon oxide.

10. The vertical semiconductor device of claim 1, wherein the barrier oxide directly contacts the concave portion and the convex portion.

11. The vertical semiconductor device of claim 1, wherein the second conductive layer includes a first end and a second end,
wherein the first end of the second conductive layer is laterally spaced from the channel layer by the first conductive layer, and
wherein the second end of the second conductive layer is fully covered by the barrier oxide.

12. The vertical semiconductor device of claim 1, wherein the lower stack includes:
a lower source layer; and
an upper source layer over the lower source layer,
wherein the source channel contact is disposed between the lower source layer and the upper source layer.

13. The vertical semiconductor device of claim 1, further comprising:
a vertical source line disposed in the vertical contact recess.

14. The vertical semiconductor device of claim 1, further comprising:
- a tunnel dielectric layer on the channel layer;
- a charge storage layer on the tunnel dielectric layer; and
- a blocking layer on the charge storage layer,
- wherein the tunnel dielectric layer, the charge storage layer and the blocking layer are penetrating the upper stack and extending in the lower stack.

* * * * *